United States Patent
Bonser et al.

(10) Patent No.: US 6,245,581 B1
(45) Date of Patent: Jun. 12, 2001

(54) METHOD AND APPARATUS FOR CONTROL OF CRITICAL DIMENSION USING FEEDBACK ETCH CONTROL

(75) Inventors: Douglas Bonser; Anthony J. Toprac; Matthew Purdy; John R. Behnke; James H. Hussey, Jr., all of Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 09/552,491

(22) Filed: Apr. 19, 2000

(51) Int. Cl.[7] .................................................. H01L 21/00
(52) U.S. Cl. ............................ 438/8; 156/345; 216/59; 216/84; 438/689; 438/710; 438/745
(58) Field of Search ............................. 438/8, 9, 14, 16, 438/689, 710, 719, 735, 745, 752, 753; 216/59, 60–61, 84, 85, 86; 156/345 LC, 345 MT

(56) References Cited

U.S. PATENT DOCUMENTS

| 5,690,785 | * | 11/1997 | Nakaya ..................................... 438/8 |
| 5,885,472 | * | 3/1999 | Miyazaki et al. ..................... 438/9 X |
| 6,018,688 | * | 1/2000 | Hashimoto ........................... 438/8 X |

* cited by examiner

Primary Examiner—William Powell
(74) Attorney, Agent, or Firm—Williams, Morgan & Amerson, P.C.

(57) ABSTRACT

The present invention provides for a method and an apparatus for controlling critical dimensions. At least one run of semiconductor devices is processed. A critical dimension measurement is performed upon at least one of the processed semiconductor device. An analysis of the critical dimension measurement is performed. A secondary process upon the semiconductor device in response to the critical dimension analysis is performed.

26 Claims, 4 Drawing Sheets

METHOD AND APPARATUS FOR CONTROL OF CRITICAL DIMENSION USING FEEDBACK ETCH CONTROL

BACKGROUND OF THE INVENTION

1. Field of the Invention

This invention relates generally to semiconductor products manufacturing, and, more particularly, to a method and apparatus for performing control of critical dimension using a secondary etch process on semiconductor devices.

2. Description of the Related Art

The technology explosion in the manufacturing industry has resulted in many new and innovative manufacturing processes. Today's manufacturing processes, particularly semiconductor manufacturing processes, call for a large number of important steps. These process steps are usually vital, and therefore, require a number of inputs that are generally fine-tuned to maintain proper manufacturing control.

The manufacture of semiconductor devices requires a number of discrete process steps to create a packaged semiconductor device from raw semiconductor material. The various processes, from the initial growth of the semiconductor material, the slicing of the semiconductor crystal into individual wafers, the fabrication stages (etching, doping, ion implanting, or the like), to the packaging and final testing of the completed device, are so different from one another and specialized that the processes may be performed in different manufacturing locations that contain different control schemes.

Among the important aspects in semiconductor device manufacturing are RTA control, chemical-mechanical polishing (CMP) control, etching, and overlay control. Generally, after a photolithography process is performed on a semiconductor device, an etch process is performed on the semiconductor device for forming a plurality of sub-sections within a semiconductor device, such as a gate. As technology facilitates smaller critical dimensions for semiconductor devices, the need for reduction of errors increases dramatically.

Generally, process engineers currently analyze the process errors a few times a month. The results from the analysis of the process errors are used to make updates to process tool settings manually. Generally, a manufacturing model is employed to control the manufacturing processes. Some of the problems associated with the current methods include the fact that the process tool settings are only updated a few times a month. Furthermore, currently the process tool updates are generally performed manually. Many times, errors in semiconductor manufacturing are not organized and reported to quality control personal. Often, the manufacturing models themselves incur bias errors that could compromise manufacturing quality. Proper formation of sub-sections within a semiconductor device is important in proper performance of the manufactured semiconductor device. Critical dimensions of the sub-sections, such as poly-silicon gates, generally have to be within a predetermined acceptable margin of error for semiconductor devices to be within acceptable manufacturing quality.

Generally, a set of processing steps is performed on a lot of wafers on a semiconductor manufacturing tool called an exposure tool or a stepper, followed by processing of the semiconductor wafers in etch tools. The manufacturing tool communicates with a manufacturing framework or a network of processing modules. The manufacturing tool is generally connected to an equipment interface. The equipment interface is connected to a machine interface to which the etcher is connected, thereby facilitating communications between the stepper and the manufacturing framework. The machine interface can generally be part of an advanced process control (APC) system. The APC system initiates a control script based upon a manufacturing model, which can be a software program that automatically retrieves the data needed to execute a manufacturing process. Often, semiconductor devices are staged through multiple manufacturing tools for multiple processes, generating data relating to the quality of the processed semiconductor devices. Many times, errors can occur during the processing of semiconductor devices. These errors can cause appreciable inconsistencies in the critical dimensions of multiple parameters in the processed semiconductor devices. Furthermore, it is important to reduce errors to cause the critical dimensions of the parameters of the processed semiconductor device to be within acceptable tolerance margins.

The present invention is directed to overcoming, or at least reducing the effects of, one or more of the problems set forth above.

SUMMARY OF THE INVENTION

In one aspect of the present invention, a method is provided for controlling critical dimensions. At least one run of semiconductor devices is processed. A critical dimension measurement is performed upon at least one of the processed semiconductor device. An analysis of the critical dimension measurement is performed. A secondary process upon the semiconductor device in response to the critical dimension analysis is performed.

In another aspect of the present invention, an apparatus for controlling critical dimensions is provided. The apparatus of the present invention comprises: a photolithography process tool capable of performing photolithography processes on a semiconductor device; a photolithography metrology tool coupled with the photolithography process tool, the photolithography metrology tool being capable of acquiring photolithography metrology data; a standard etch-processing tool capable of receiving the semiconductor device from the photolithography metrology tool; a standard etch-processing metrology tool coupled with the standard etch-processing process tool, the standard etch-processing metrology being capable of acquiring standard etch-processing metrology data; a secondary etch-processing tool capable of receiving the semiconductor device from the standard etch-processing metrology tool; a secondary etch-processing metrology tool coupled with the secondary etch-processing tool, the secondary etch-processing metrology tool metrology being capable of acquiring secondary etch-processing metrology data; a control algorithm capable of receiving at least one of photolithography metrology data, standard etch-processing metrology data, and secondary etch-processing metrology data, the control algorithm being capable of controlling at least one of the photolithography metrology tool, the standard etch-processing tool, and the secondary etch-processing tool.

BRIEF DESCRIPTION OF THE DRAWINGS

The invention may be understood by reference to the following description taken in conjunction with the accompanying drawings, in which like reference numerals identify like elements, and in which.

Figure 1:
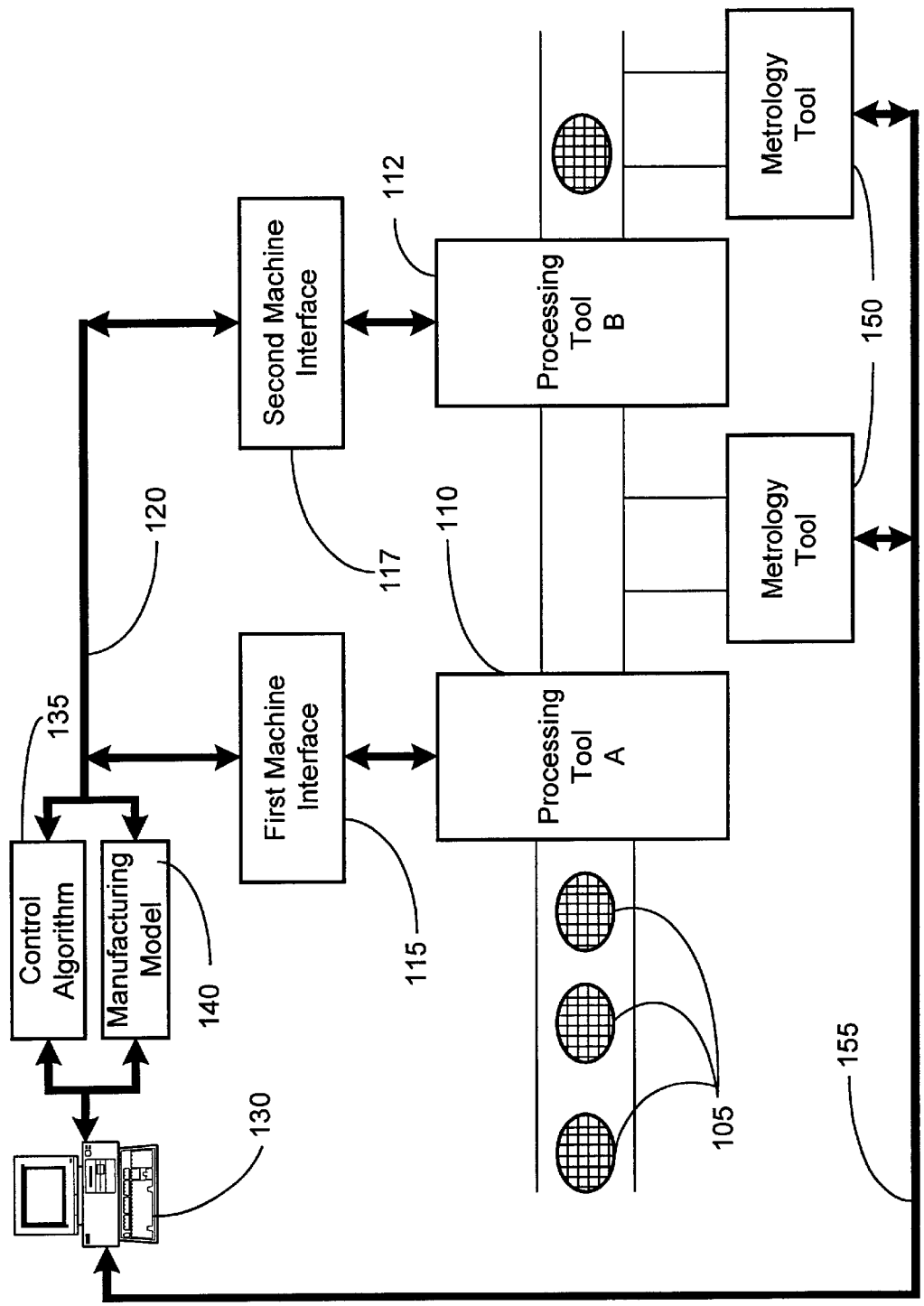
FIG. 1 illustrates one embodiment of the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

There are many discrete processes that are involved in semiconductor manufacturing. Many times, semiconductor devices are stepped through multiple manufacturing process tools. As semiconductor devices are processed through manufacturing tools, production data, or manufacturing data, is generated. The production data can be used to perform fault detection analysis that can lead to improved manufacturing results. Etching processes are among the important groups of process steps in semiconductor manufacturing. In particular, critical dimension measurements are made after manufacturing processes such as photolithography and photoresist etching processes. The critical dimension data can be used to make adjustments to manufacturing processes for subsequent manufacturing runs of semiconductor devices, such as semiconductor wafers. Proper measurement of critical dimensions in the semiconductor wafers is important in making adjustments to subsequent manufacturing processes. Photolithography and etching processes affect the critical dimensions of sub-sections, such as polysilicon gate structures, in semiconductor devices being manufactured.

One of the most important parts of manufacturing data, or production data, is critical dimension measurements. Feedback of critical dimension data in manufacturing processes can be utilized to improve the critical dimensions of portions of a processed semiconductor wafer, such as polysilicon gate structures. Control of polysilicon gate critical dimensions affects the production quality of semiconductor products, such as microprocessors, memory, and the like. In many cases, the critical dimensions correlate directly to the performance of semiconductor devices. For example, the critical dimension of a semiconductor device affects the speed of the functionality of the semiconductor device. As a result, excessive variation in critical dimension control can result in unacceptably slow semiconductor devices, high revenue fast parts, and a large number of high leakage products from unacceptably fast semiconductor devices.

However, performing near optimal process control to achieve acceptable critical dimension values is a complex task primarily due to continual drift and step changes that occur in the photolithography and etching tools. A process controller (not shown), such as an advanced process control (APC) system, utilizes critical dimension measurements to make adjustments to manufacturing processes that result in more consistent critical dimensions in the semiconductor devices. The accuracy of the critical dimension measurements is important in performing effective control of critical dimension values. One of the critical dimension measurements that are made is the measurement of the width of a polysilicon line in a semiconductor wafer that is being processed.

One step in controlling critical dimensions is keeping track of the shifts and other changes in the performance in the tool that measures the critical dimensions in a semiconductor wafer. Critical dimension data can be used to perform a plurality of modifications to control inputs of subsequent process steps, which can result in more accurate construction of critical dimension features in the sub-sections of a semiconductor device being manufactured. In one embodiment, critical dimension data can be used to perform a secondary etch process, after completing a standard etch process, to produce a semiconductor device that contains more accurate critical dimension features. In an alternative embodiment, the standard etch process can be performed, intentionally undershooting, or broadening, the critical dimensions of features in the sub-sections of the semiconductor device, which would be followed by a secondary etch process for fine tuning the critical dimensions of features in the semiconductor device.

Turning now to FIG. 1, one embodiment of the present invention is illustrated. In one embodiment, semiconductor products 105, such as semiconductor wafers are processed on processing tools 110, 112 using a plurality of control input signals on a line 120. In one embodiment, the control input signals on the line 120 are sent to the processing tools 110, 112 from a computer system 130 via machine interfaces 115, 117. In one embodiment, the first and second machine interfaces 115, 117 are located outside the processing tools 110, 112. In an alternative embodiment, the first and second machine interfaces 115, 117 are located within the processing tools 110, 112.

In one embodiment, the computer system 130 sends control input signals on a line 120 to the first and second machine interfaces 115, 117. The computer system 130 employs a manufacturing model 140 to generate the control input signals on the line 120. A control algorithm 135, which in one embodiment is a computer software program, is utilized by the computer system 130 to control the manufacturing processes performed by the processing tools 110, 112. In one embodiment, the control algorithm 135 is integrated into the computer system 130.

In one embodiment, the manufacturing model 140 defines a process script and input control that implement a particular manufacturing process. The control input signals on a line 120 that are intended for processing tool A 110 are received and processed by the first machine interface 115. The control input signals on a line 120 that are intended for processing tool B 112 are received and processed by the second machine interface 117. Examples of the processing tools 110, 112 used in semiconductor manufacturing processes are steppers and etch process tools. In one embodiment, processing tool A 110 is a standard etch process tool and processing tool B 112 is a secondary etch process tool.

A metrology tool 150, such as a critical dimension measurement tool, is employed in the semiconductor device manufacturing system illustrated in FIG. 1. In one embodiment, the metrology tool 150 is capable of performing critical dimension measurements on semiconductor products 105 that are processed by the processing tools 110, 112. In one embodiment, data from the metrology tool 150 is sent, on a line 155, to the computer system 130, which in one embodiment is part of a process control system (not shown), such as an APC system. In one embodiment, the computer system 130, utilizing the control algorithm 135, is capable of making adjustment to the manufacturing processes performed by the processing tools 110, 112 in response to the data acquired by the metrology tool 150.

Figure 2:
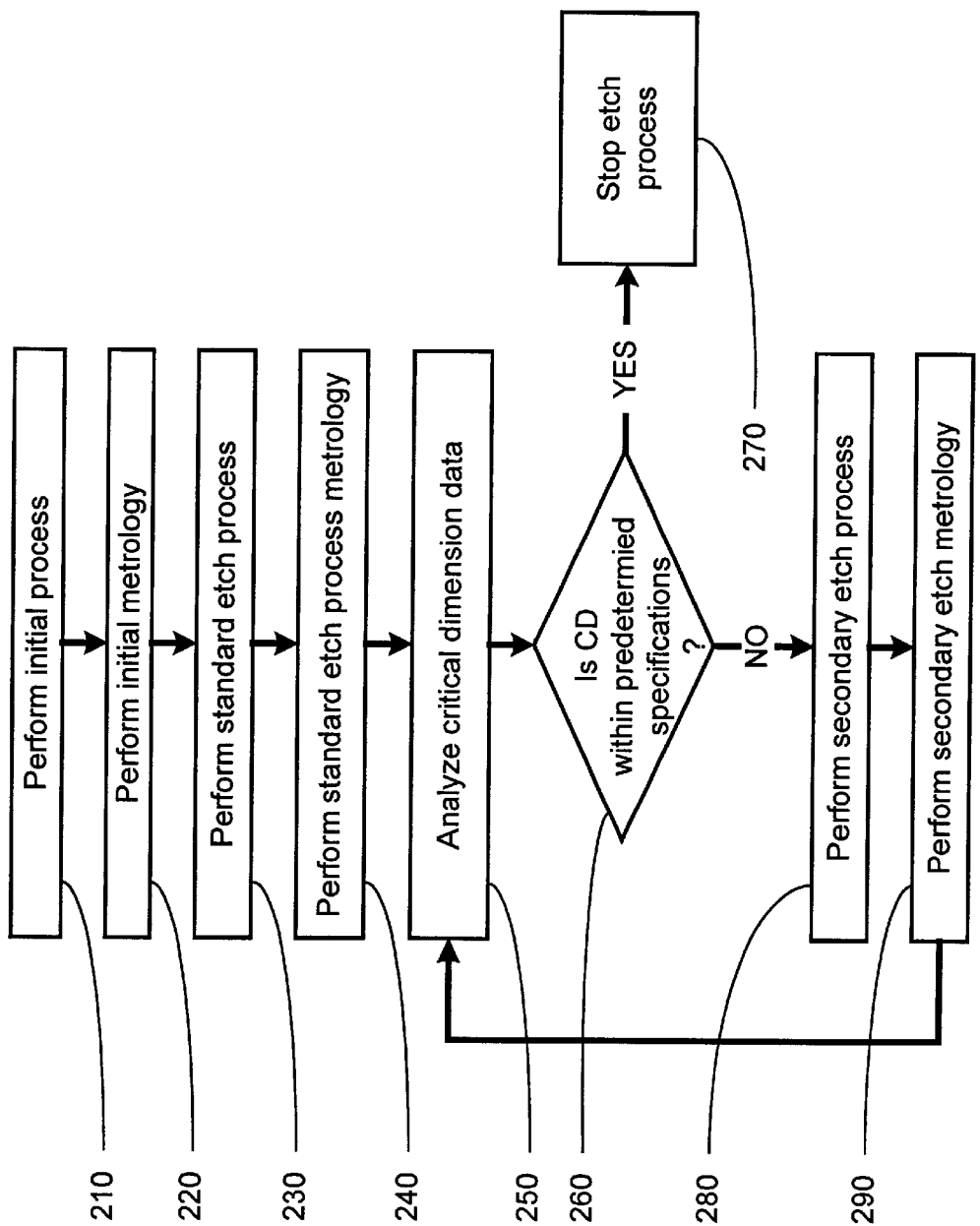
FIG. 2 illustrates a flowchart representation of one method of performing critical dimension control, as taught by the present invention.

Turning now to FIG. 2, a flowchart representation of one method of controlling of critical dimensions in processing of semiconductor devices, such as semiconductor wafers, as taught by the present invention, is illustrated. In one embodiment, an initial process is performed on a semiconductor wafer, as illustrated in block 210 of FIG. 2. In one embodiment, the initial process performed on the semiconductor wafer is a photolithography process. Once the initial process is completed, a metrology-data acquisition procedure is performed on the processed semiconductor wafer using a metrology tool 150, as described in block 220 of FIG. 2. The metrology data is sent to the computer system 130 for later adjustments of subsequent process steps to be performed on the semiconductor wafer.

Figure 3:
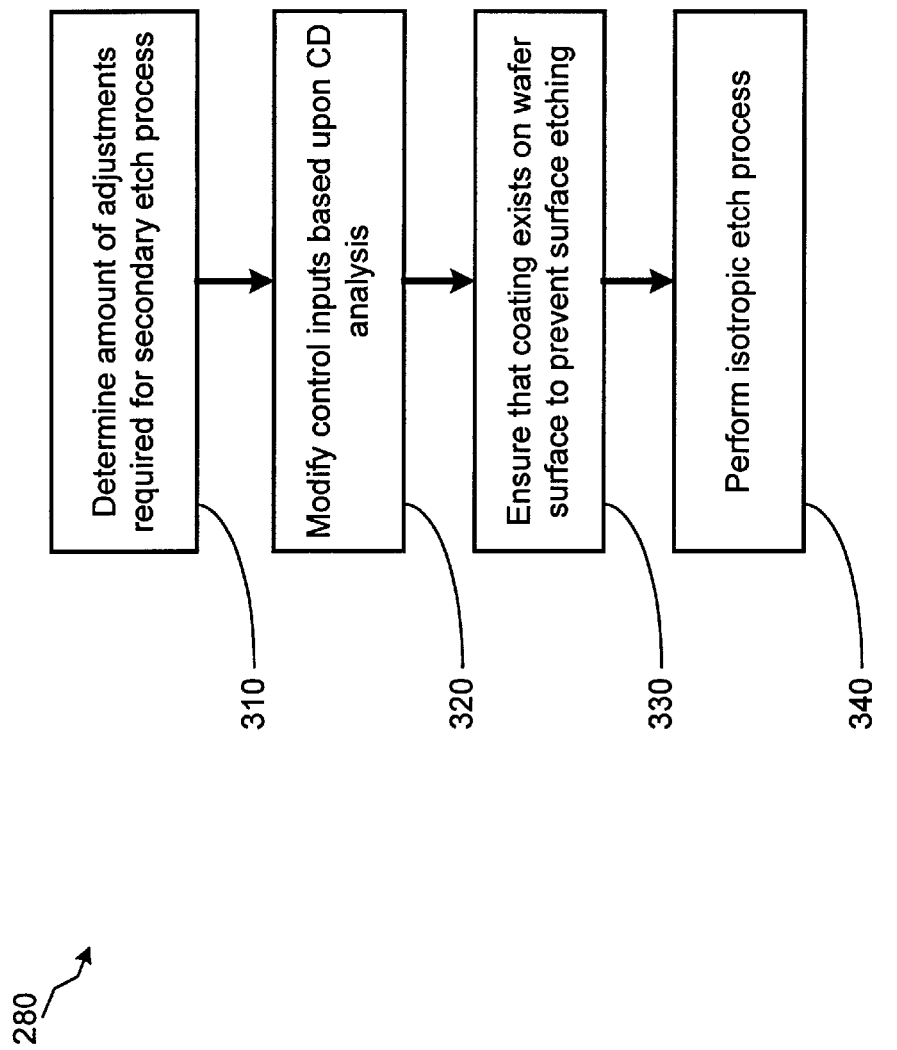
FIG. 3 illustrates a flowchart representation of a more detailed depiction of the method of performing secondary etching described in FIG. 2.

A standard etch process is then performed on the semiconductor wafer, as described in block 230 of FIG. 2. In one embodiment, the standard etch process is performed such that a target critical dimension for sub-sections of the semiconductor wafer, such as poly-silicon gate structures, is attempted. In an alternative embodiment, the standard etch process is performed such that the target critical dimension is not achieved, but instead, sub-sections with wider critical dimensions are produced. Once the standard etch process is completed, a standard etch process metrology data acquisition is performed, as described in block 240 of FIG. 2. One embodiment of the method for acquiring standard etch process metrology data is illustrated in FIG. 3.

Once the standard etch process metrology data is acquired, a critical dimension analysis is performed on the semiconductor wafer using the photolithography metrology data and the standard etch process metrology data, as described in block 250 of FIG. 2. The critical dimension analysis that is performed on the semiconductor wafers can be performed using one or more of a plurality of methods that are known to those skilled in the art, including measuring the width and the spacing of signal traces on the semiconductor wafer.

Once the critical dimension analysis is performed on the semiconductor wafer being processed, a determination is made whether the critical dimension of the semiconductor wafer is within predetermined specifications, as described in block 260 of FIG. 2. The critical dimension data, which is based on the photolithography metrology data and the standard etch process metrology data of a particular semiconductor wafer being processed, is compared to a set of predetermined minimum dimensions and a set of predetermined maximum dimensions. The set of predetermined minimum dimensions and the set of predetermined maximum dimensions are generally customized for the particular type of semiconductor devices being manufactured and are known to those skilled in the art. When a determination is made that the critical dimension of the semiconductor wafers is below a predetermined set of minimum dimensions or above a predetermined set of maximum dimensions, the critical dimension of the semiconductor wafers is outside an acceptable tolerance.

When a determination is made that the critical dimensions of the wafers that were processed under the standard etch process step are within predetermined specifications, the etch process is concluded, as described in block 270 of FIG. 2. When a determination is made that the critical dimensions of the wafers that were processed under the standard etch process step are not within predetermined specifications, a secondary etch process is performed on the semiconductor wafer, as described in block 280 of FIG. 2. A flowchart representation of a more detailed depiction of the method of performing the secondary etch is described in FIG. 3.

Turning now to FIG. 3, a determination is made regarding the amount of adjustment needed for the control settings for the secondary etch process, as described in block 310 of FIG. 3. In one embodiment, the amount of adjustment required for the control setting for the secondary etch process is determined using the data from the critical dimension analysis described in FIG. 2, which can be performed by one skilled in the art. The control settings are modified for the secondary etch process, based on the critical dimension analysis, as described in block 320 of FIG. 3. The control settings that are modified include signals that modify the process gas flow rate, such the flow rate of Carbon Tetra-Floride ($CF_4$), signals that modify the etch time-period, signals that modify the power, signals that modify the pressure of the etch process, and signals that modify the operating temperature during the etch process.

Once the control settings are determined for the secondary etch process, in one embodiment, a determination is made whether a coating exists on the surface of the semiconductor wafer before the secondary etch process is commenced, as described in block 330 of FIG. 3. In one embodiment, an anti-reflective coat is placed on the surface of the semiconductor wafer prior to the photolithography process. The coating applied on the surface of the semiconductor wafer behaves as a hard mask, preventing etching from taking place on the top surface of the poly-silicon line. In one embodiment, if a determination is made that sufficient coating is not present on the semiconductor wafer, a coating can be deposited upon the semiconductor wafer. Generally, the secondary etch process is designed to perform further etching of the sidewalls of the sub-sections of the semiconductor wafer, such as the sidewalls of the polysilicon gate structures Once a determination is made that sufficient anti-etch coating is present on the surface of the semiconductor wafers, an isotropic secondary etch process is performed, as described in block 340 of FIG. 3. Turning back to FIG. 2, once the secondary etch process is concluded, a secondary etch metrology data acquisition is performed on the processed semiconductor wafer, as described in block 290. In one embodiment, further critical dimension analysis is performed and comparison to the predetermined specification is made to determine whether further secondary etch processes are to be performed, as illustrated in FIG. 2. The secondary etch process is a selective etch process. In other words, the secondary etch process is generally used to remove the sidewalls on the semiconductor wafer while not removing the underlying gate-oxide region or the overlaying anti-reflective coating on the semiconductor wafer.

Figure 4:
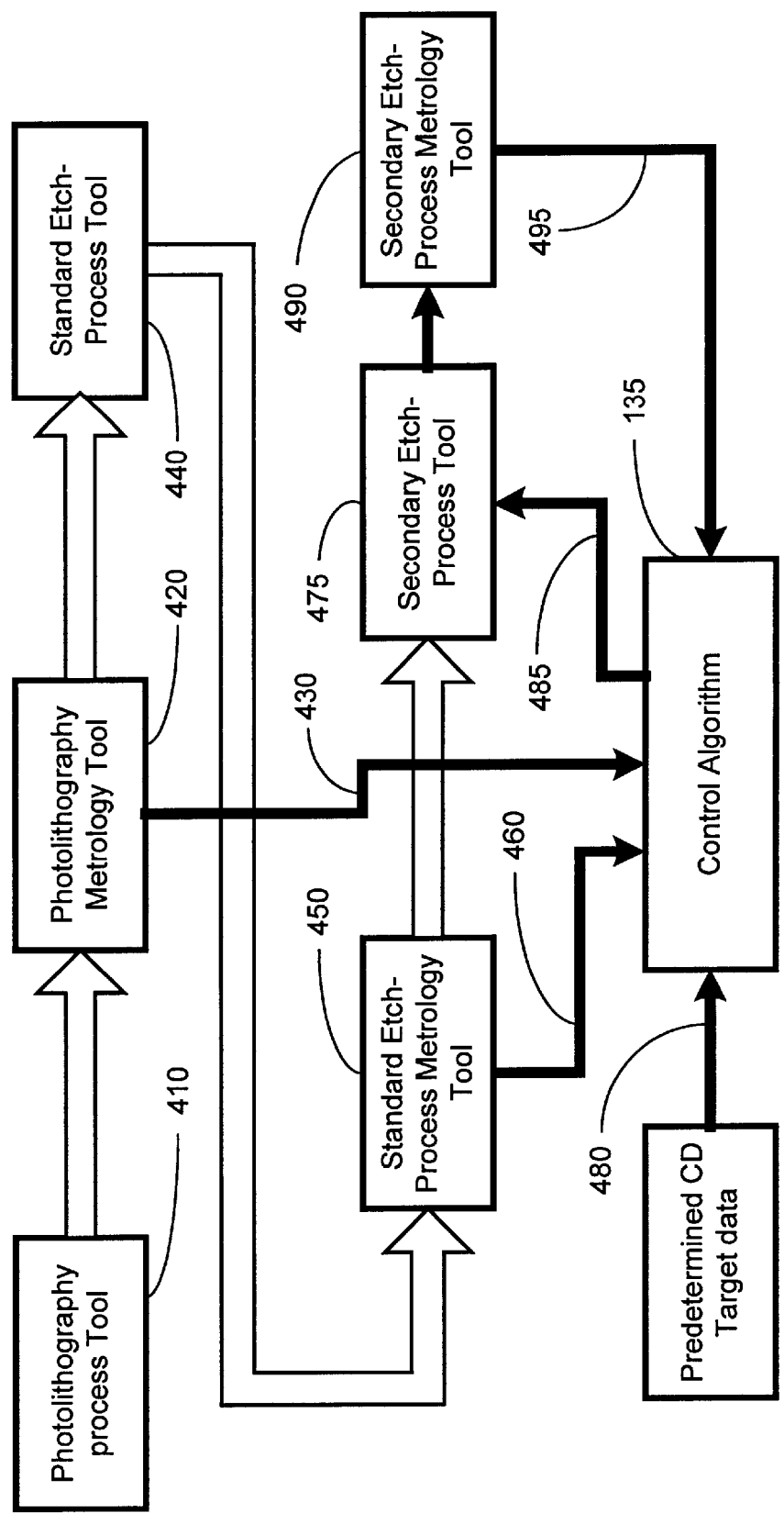
FIG. 4 illustrates a block diagram representation of one embodiment of the apparatus taught by the present invention.

Turning now to FIG. 4, one embodiment of the apparatus for implementing the methods taught by the present invention is illustrated. In one embodiment, a photolithography process tool 410 is used to process semiconductor devices, such as a semiconductor wafer. The semiconductor wafer is then sent to a photolithography metrology tool 420 for acquisition of photolithography metrology data. In one embodiment, the photolithography metrology data is sent to the control algorithm 135 on a line 430. In one embodiment, the control algorithm 135 is integrated with the computer system 130.

The semiconductor wafer is then processed in the standard etch-process tool 440. The semiconductor wafer is sent to the standard etch-processing metrology tool 450 for acquisition of standard etch-processing metrology data. The standard etch-processing metrology data is sent to the control algorithm 135 on a line 460. The control algorithm 135 also receives a set of predetermined critical dimension data on a line 480. In one embodiment, the predetermined critical dimension target data in entered into the computer system 130, which then routes the data to the control algorithm 135 via the line 480. The control algorithm 135 performs critical dimension analysis on the semiconductor wafer based on the predetermined critical dimension data, the photolithography metrology data and the standard etch-processing metrology data.

When the control algorithm 135 determines that the critical dimensions of the semiconductor wafer is not within a predetermined tolerance, the control algorithm 135 initiates a secondary etch process using the secondary etch-process tool 475. The control algorithm 135 determines a modified set of control settings and sends the control input signals to the secondary etch-process tool 475 on a line 485. Once the secondary etch-process tool 475 performs further fine-tuned etching on the semiconductor wafer, the semiconductor wafer is sent to the secondary etch-process metrology tool 490 for acquisition of secondary etch-process metrology data, which is sent to the control algorithm on a line 495. The control algorithm then determines whether further etch process is needed or whether the critical dimension of the semiconductor wafer are within the predetermined target specifications. One of the goals of the present invention is to produce semiconductor wafers with consistent critical dimensions of sub-sections, such as polysilicon gate structures, in the semiconductor wafer.

The principles taught by the present invention can be implemented in an Advanced Process Control (APC) Framework. The APC is a preferred platform from which to implement the etch process control strategy taught by the present invention. In some embodiments, the APC can be a factory-wide software system, therefore, the control strategies taught by the present invention can be applied to virtually any of the semiconductor manufacturing tools on the factory floor. The APC framework also allows for remote access and monitoring of the process performance. Furthermore, by utilizing the APC framework, data storage can be more convenient, more flexible, and less expensive than local drives. The APC platform allows for more sophisticated types of control because it provides a significant amount of flexibility in writing the necessary software code.

Deployment of the control strategy taught by the present invention onto the APC framework could require a number of software components. In addition to components within the APC framework, a computer script is written for each of the semiconductor manufacturing tools involved in the control system. When a semiconductor manufacturing tool in the control system is started in the semiconductor manufacturing fab, it generally calls upon a script to initiate the action that is required by the process controller, such as the etch process controller. The control methods are generally defined and performed in these scripts. The development of these scripts can comprise a significant portion of the development of a control system.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method for controlling critical dimensions, comprising:

processing at least one run of semiconductor devices;

performing a critical dimension measurement upon at least one of said processed semiconductor device;

performing an analysis of said critical dimension measurement; and performing a secondary process upon said semiconductor device in response to said critical dimension analysis.

2. The method described in claim 1, wherein performing a process run of semiconductor devices further comprises processing semiconductor wafers.

3. The method described in claim 1, wherein performing a critical dimension measurement further comprises performing critical dimension measurements on a polysilicon gate.

4. The method described in claim 3, wherein performing a critical dimension measurement further comprises measuring a width of a polysilicon line.

5. The method described in claim 1, wherein performing a secondary process upon said semiconductor device further comprises performing a secondary etch process.

6. The method described in claim 5, wherein performing a secondary etch process further comprises:

determining an amount of critical dimension adjustments to be made on said semiconductor device;

modifying at least one control input signal for controlling said secondary etch process;

using a mask for preventing etching on the surface of said semiconductor device; and performing an isotropic etching process on said semiconductor device.

7. The method described in claim 6, wherein modifying at least one control input signal further comprises modifying a signal that controls a flow rate of a process gas.

8. The method described in claim 6, wherein modifying at least one control input signal further comprises modifying a signal that controls an etch time period.

9. The method described in claim 6, wherein modifying at least one control input signal further comprises modifying a signal that controls a power level of an etch process.

10. The method described in claim 6, wherein modifying at least one control input signal further comprises modifying a signal that controls a pressure level of an etch process.

11. The method described in claim 6, wherein modifying at least one control input signal further comprises modifying a signal that controls a temperature setting during an etch process.

12. An apparatus for controlling critical dimensions, comprising:
- a photolithography process tool capable of performing photolithography processes on a semiconductor device;
- a photolithography metrology tool coupled with said photolithography process tool, said photolithography metrology tool being capable of acquiring photolithography metrology data;
- a standard etch-processing tool capable of receiving said semiconductor device from said photolithography metrology tool;
- a standard etch-processing metrology tool coupled with said standard etch-processing process tool, said standard etch-processing metrology being capable of acquiring standard etch-processing metrology data;
- a secondary etch-processing tool capable of receiving said semiconductor device from said standard etch-processing metrology tool;
- a secondary etch-processing metrology tool coupled with said secondary etch-processing tool, said secondary etch-processing metrology tool metrology being capable of acquiring secondary etch-processing metrology data;
- a control algorithm capable of receiving at least one of photolithography metrology data, standard etch-processing metrology data, and secondary etch-processing metrology data, said control algorithm being capable of controlling at least one of said photolithography metrology tool, said standard etch-processing tool, and said secondary etch-processing tool.

13. The apparatus of claim 12, wherein said control algorithm is integrated into a process control system.

14. The apparatus of claim 13, wherein said process control system is an Advanced Process Control framework.

15. An apparatus for controlling critical dimensions, comprising:
- means for processing at least one run of semiconductor devices;
- means for performing a critical dimension measurement upon at least one of said processed semiconductor device;
- means for performing an analysis of said critical dimension measurement; and
- means for performing a secondary process upon said semiconductor device in response to said critical dimension analysis.

16. A computer readable program storage device encoded with instructions that, when executed by a computer, performs a method for controlling critical dimensions, comprising:
- processing at least one run of semiconductor devices;
- performing a critical dimension measurement upon at least one of said processed semiconductor device;
- performing an analysis of said critical dimension measurement; and
- performing a secondary process upon said semiconductor device in response to said critical dimension analysis.

17. The computer readable program storage device encoded with instructions that, when executed by a computer, performs the method described in claim 16, wherein performing a process run of semiconductor devices further comprises processing semiconductor wafers.

18. The computer readable program storage device encoded with instructions that, when executed by a computer, performs the method described in claim 16, wherein performing critical dimension measurements further comprises performing a critical dimension measurement on a polysilicon gate.

19. The computer readable program storage device encoded with instructions that, when executed by a computer, performs the method described in claim 18, wherein performing a critical dimension measurement further comprises measuring a width of a polysilicon line.

20. The computer readable program storage device encoded with instructions that, when executed by a computer, performs the method described in claim 16, wherein performing a secondary process upon said semiconductor device further comprises performing a secondary etch process.

21. The computer readable program storage device encoded with instructions that, when executed by a computer, performs the method described in claim 20, wherein performing a secondary etch process further comprises:
- determining an amount of critical dimension adjustments to be made on said semiconductor device;
- modifying at least one control input signal for controlling said secondary etch process;
- using a hard mask for preventing etching on the surface of said semiconductor device; and
- performing an isotropic etching process on said semiconductor device.

22. The computer readable program storage device encoded with instructions that, when executed by a computer, performs the method described in claim 21, wherein modifying at least one control input signal further comprises modifying a signal that controls a flow rate of a process gas.

23. The computer readable program storage device encoded with instructions that, when executed by a computer, performs the method described in claim 21, wherein modifying at least one control input signal further comprises modifying a signal that controls an etch time period.

24. The computer readable program storage device encoded with instructions that, when executed by a computer, performs the method described in claim 21, wherein modifying at least one control input signal further comprises modifying a signal that controls a power level of an etch process.

25. The computer readable program storage device encoded with instructions that, when executed by a computer, performs the method described in claim 21, wherein modifying at least one control input signal further comprises modifying a signal that controls a pressure level of an etch process.

26. The computer readable program storage device encoded with instructions that, when executed by a computer, performs the method described in claim 21, wherein modifying at least one control input signal further comprises modifying a signal that controls a temperature setting during an etch process.

* * * * *